United States Patent
Rendek, Jr. et al.

(10) Patent No.: US 8,693,203 B2
(45) Date of Patent: Apr. 8, 2014

(54) METHOD OF MAKING AN ELECTRONIC DEVICE HAVING A LIQUID CRYSTAL POLYMER SOLDER MASK LAMINATED TO AN INTERCONNECT LAYER STACK AND RELATED DEVICES

(75) Inventors: Louis Joseph Rendek, Jr., West Melbourne, FL (US); Michael Weatherspoon, West Melbourne, FL (US); Casey Philip Rodriguez, Indialantic, FL (US); David Nicol, West Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 294 days.

(21) Appl. No.: 13/007,035

(22) Filed: Jan. 14, 2011

(65) Prior Publication Data

US 2012/0182703 A1 Jul. 19, 2012

(51) Int. Cl.
*H05K 1/00* (2006.01)

(52) U.S. Cl.
USPC ............ 361/750; 361/760; 174/255; 174/256; 174/257; 174/258; 174/261; 174/262; 174/263; 174/266; 29/840; 29/847; 29/852; 257/700; 257/738; 257/686; 257/778; 257/784; 428/209; 428/323; 428/473.5; 438/107; 438/612

(58) Field of Classification Search
USPC .......... 361/750, 760; 174/255–258, 261–263, 174/266; 29/840, 847, 852; 257/700, 738; 257/686, 778; 428/209, 323, 473.5; 438/107, 612
See application file for complete search history.

(56) References Cited

U.S. PATENT DOCUMENTS

| 5,126,192 A | * | 6/1992 | Chellis et al. .................. 428/323 |
| 5,449,591 A | * | 9/1995 | Sato et al. ...................... 430/313 |
| 5,534,094 A | | 7/1996 | Arjavalingam et al. ....... 156/155 |
| 5,615,477 A | * | 4/1997 | Sweitzer ......................... 29/840 |
| 5,633,072 A | * | 5/1997 | Middelman et al. ........... 428/209 |
| 6,121,553 A | * | 9/2000 | Shinada et al. ............... 174/259 |

(Continued)

FOREIGN PATENT DOCUMENTS

| EP | 1215948 | 6/2002 |
| EP | 2001274 | 12/2008 |
| EP | 2237652 | 10/2010 |
| WO | 2008102692 | 8/2008 |

OTHER PUBLICATIONS

Culbertson, Edwin C., "A New Laminate Material for High Performance PCBs: Liquid Crystal Polymer Copper Clad Films," IEEE, pp. 520-523, 1995.

(Continued)

*Primary Examiner* — Xiaoliang Chen
(74) *Attorney, Agent, or Firm* — Allen, Dyer, Doppelt, Milbrath & Gilchrist, P.A.

(57) ABSTRACT

A method for making an electronic device includes forming an interconnect layer stack on a rigid wafer substrate having a plurality of patterned electrical conductor layers, a dielectric layer between adjacent patterned electrical conductor layers, and at least one solder pad on an uppermost patterned electrical conductor layer. An LCP solder mask having at least one aperture therein alignable with the at least one solder pad is formed. The LCP solder mask and interconnect layer stack are aligned and laminated together. Solder is positioned in the at least one aperture. At least one circuit component is attached to the at least one solder pad using the solder.

11 Claims, 4 Drawing Sheets

(56) References Cited

U.S. PATENT DOCUMENTS

| | | | |
|---|---|---|---|
| 6,183,588 B1 | 2/2001 | Kelly et al. | 156/247 |
| 6,207,077 B1* | 3/2001 | Burnell-Jones | 252/301.36 |
| 6,221,769 B1 | 4/2001 | Dhong et al. | |
| 6,242,078 B1* | 6/2001 | Pommer et al. | 428/209 |
| 6,262,579 B1* | 7/2001 | Chazan et al. | 324/537 |
| 6,310,391 B1* | 10/2001 | Nagasawa et al. | 257/700 |
| 6,329,610 B1* | 12/2001 | Takubo et al. | 174/264 |
| 6,353,501 B1* | 3/2002 | Woodruff et al. | 359/585 |
| 6,372,992 B1 | 4/2002 | Yang | 174/117 F |
| 6,576,998 B1* | 6/2003 | Hoffman | 257/724 |
| 6,764,748 B1* | 7/2004 | Farquhar et al. | 428/209 |
| 6,998,327 B2 | 2/2006 | Danielson et al. | 438/455 |
| 7,916,492 B1* | 3/2011 | Zhong et al. | 361/760 |
| 2001/0010367 A1* | 8/2001 | Burnell-Jones | 252/301.36 |
| 2001/0024839 A1* | 9/2001 | Lin | 438/106 |
| 2001/0042637 A1* | 11/2001 | Hirose et al. | 174/255 |
| 2002/0005591 A1* | 1/2002 | Lin | 257/784 |
| 2002/0075203 A1* | 6/2002 | Woodruff et al. | 345/41 |
| 2003/0055179 A1* | 3/2003 | Ota et al. | 525/242 |
| 2003/0085383 A1* | 5/2003 | Burnell-Jones | 252/301.36 |
| 2003/0164541 A1* | 9/2003 | Lee | 257/686 |
| 2003/0214461 A9* | 11/2003 | Woodruff et al. | 345/41 |
| 2004/0025333 A1* | 2/2004 | Hirose et al. | 29/830 |
| 2004/0105989 A1* | 6/2004 | Ohta et al. | 428/473.5 |
| 2004/0182509 A1* | 9/2004 | Farquhar et al. | 156/250 |
| 2004/0197952 A1* | 10/2004 | Lee | 438/107 |
| 2005/0067686 A1 | 3/2005 | Usui et al. | |
| 2005/0112798 A1 | 5/2005 | Bjorbell | 438/106 |
| 2005/0140026 A1* | 6/2005 | Salmon | 257/778 |
| 2006/0060956 A1* | 3/2006 | Tanikella | 257/686 |
| 2006/0068586 A1 | 3/2006 | Burdick, Jr. et al. | 438/586 |
| 2006/0102384 A1* | 5/2006 | Watanabe et al. | 174/256 |
| 2006/0220244 A1* | 10/2006 | Lu et al. | 257/738 |
| 2007/0025092 A1 | 2/2007 | Lee et al. | 361/761 |
| 2007/0062722 A1* | 3/2007 | Tanaka et al. | 174/254 |
| 2007/0096328 A1* | 5/2007 | Takahashi et al. | 257/774 |
| 2008/0041615 A1* | 2/2008 | Zhong et al. | 174/255 |
| 2008/0061437 A1* | 3/2008 | Kohara et al. | 257/738 |
| 2008/0087986 A1* | 4/2008 | Tanikella | 257/643 |
| 2008/0173473 A1* | 7/2008 | Hirose et al. | 174/266 |
| 2008/0189943 A1* | 8/2008 | Hirose et al. | 29/852 |
| 2009/0084595 A1* | 4/2009 | Park et al. | 174/261 |
| 2009/0212443 A1* | 8/2009 | Zhong | 257/778 |
| 2009/0218125 A1* | 9/2009 | Nakai et al. | 174/263 |
| 2009/0250253 A1 | 10/2009 | Park et al. | |
| 2009/0250811 A1 | 10/2009 | Pendse | |
| 2009/0255111 A1* | 10/2009 | Takahashi et al. | 29/852 |
| 2010/0000087 A1* | 1/2010 | Watanabe et al. | 29/847 |
| 2010/0065105 A1* | 3/2010 | Koran et al. | 136/251 |
| 2010/0066683 A1 | 3/2010 | Chang et al. | 345/173 |
| 2010/0078212 A1* | 4/2010 | Komatsu | 174/262 |
| 2010/0117245 A1* | 5/2010 | Zhong | 257/778 |
| 2010/0122839 A1* | 5/2010 | Akai et al. | 174/257 |
| 2010/0163288 A1* | 7/2010 | Zhong et al. | 174/258 |
| 2010/0252318 A1* | 10/2010 | Takahashi et al. | 174/262 |
| 2011/0091697 A1* | 4/2011 | Tseng et al. | 428/209 |
| 2011/0189848 A1* | 8/2011 | Ewert et al. | 438/612 |
| 2012/0077401 A1* | 3/2012 | Kotake et al. | 442/147 |

OTHER PUBLICATIONS

Narayan, C., et al., "Thin Film Transfer Process for Low Cost MCM's", IEEE/CHMT Int'l Electronics Manufacturing Technology Symposium, pp. 373-380, 1993.

T. Zhang et al., "The Processing and Assembly of Liquid Crystalline Polymer Printed Circuits," 2002 Int. Symposium on Microelectronics, pp. 1-9, 2002.

Culbertson, Edwin C., "A New Laminate Material for High Performance PCBs: Liquid Crystal Polymer Copper Clad Films," IEEE, 1995.

Narayan, C., et al., "Thin Film Transfer Process for Low Cost MCM's", IEEE/CHMT Int'l Electronics Manufacturing Technology Symposium, 1993.

T. Zhang et al., "The Processing and Assembly of Liquid Crystalline Polymer Printed Circuits," 2002 Int. Symposium on Microelectronics.

T. Zhang, et al., "Flexible Electronics: Thin Silicon Die on Flexible Substrates", IEEE Transactions on Electronics Packaging Manufacturing, vol. 32, No. 4, 291-300 (2009).

Drawings TopLine BGa SMD and NSMD Land Pattern, Oct. 22, 2010, pp. 1-4.

"When Will That Elusive Liquid Crystal Film Polymer Market Break into the Big Time?" I-CONNECT007, Source: http://www.pcb007.com/pages/zone.cgi?a=18632&z=2&v=&_pf_=1, Jan. 22, 2008, pp. 1-4.

* cited by examiner

METHOD OF MAKING AN ELECTRONIC DEVICE HAVING A LIQUID CRYSTAL POLYMER SOLDER MASK LAMINATED TO AN INTERCONNECT LAYER STACK AND RELATED DEVICES

FIELD OF THE INVENTION

The present invention relates to the field of electronic device fabrication and, more particularly, to an electronic device with a rigid silicon substrate and a liquid crystal polymer solder mask, and related methods.

BACKGROUND OF THE INVENTION

As semiconductor and integrated circuit technology has advanced, there has been a trend toward high-functionality integrated circuit components with numerous input and output (I/O) pins. Consequently, as integrated circuits get smaller, they increasingly have smaller I/O pads arranged more closely together than ever before.

To match these integrated circuits, there is a demand for printed wiring boards (PWBs) to match the footprint of these integrated circuits with closely arranged solder pads. However, the miniaturization of the spacing between the pads on the IC is currently happening at a greater rate than the miniaturization of solder pads on printed circuit boards. Consequently, there is an interconnection technology gap for some modern devices.

To make such devices function, PWBs may require extra routing layers to attach to the pads of the integrated circuits, or utilize fan-out packaging. This results in the package size of an integrated circuit being larger than the integrated circuit itself, which may limit system miniaturization. As such, additional methods of connecting integrated circuits to printed circuit boards are needed.

SUMMARY OF THE INVENTION

In view of the foregoing background, it is therefore an object of the present invention to provide a method of making an electronic device having a thin liquid crystal polymer (LCP) solder mask.

This and other objects, features, and advantages in accordance with the present invention are provided by a method of making an electronic device that includes forming an interconnect layer stack on a rigid wafer substrate, the interconnect layer stack comprising a plurality of patterned electrical conductor layers separated by a dielectric layer between adjacent patterned electrical conductor layers, and a solder pad at an uppermost patterned electrical conductor layer. The method also includes forming an LCP solder mask having an aperture therein alignable with the solder pad.

The method further includes aligning and laminating the LCP solder mask and the interconnect layer stack together, and positioning solder in the aperture. Further, the method includes attaching at least one circuit component to the solder pad using the solder. It should be appreciated that the LCP solder mask is not limited to use as a mask for solder only, and may be used for other methods of attaching the at least one circuit component to the solder pad. For example, in some embodiments, the at least one circuit component may be attached to the solder pad using other techniques, such as through the use of a conductive epoxy or the formation of intermetallic bonds.

This method presents numerous advantages, including but not limited to the creation of a thinner electronic device than the prior art, and the ability to effectively attach an electronic component to an array of solder pads having a finer pitch than the prior art. Attaching the circuit component may be accomplished by heating the solder, and the solder may be positioned in the apertures defined by the LCP solder mask by dipping the electronic device in a solder bath. Additionally or alternatively, the solder may be positioned in the apertures by depositing solder paste in the apertures.

Laminating the LCP solder mask and the interconnect layer stack together may be performed by applying heat and pressure to the LCP solder mask and the interconnect layer stack preferably in an autoclave.

Forming the LCP solder mask may be accomplished by punching or laser milling the apertures.

Forming the plurality of patterned conductor layers can be accomplished by conventional thin film deposition methodologies.

The at least one circuit component may comprise at least one integrated circuit. In addition, the LCP solder mask may have a thickness of less than 0.0015 inches. Further, the semiconductor layer may comprise an integrated circuit die.

A device aspect is directed to a device comprising a semiconductor layer, and that includes an interconnect layer stack on the semiconductor layer. The layer stack is made of a plurality of patterned electrical conductor layers, a dielectric layer between adjacent patterned electrical conductor layers, and a solder pad on an uppermost patterned electrical conductor layer. There is a LCP solder mask on the uppermost layer of the plurality of patterned electrical conductor layers and has an aperture aligned with the solder pads. In addition, there is also a fused seam between the interconnect layer stack and the LCP solder mask. Solder is disposed in the apertures, and a circuit component is electrically coupled to the solder pad via the solder.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1:
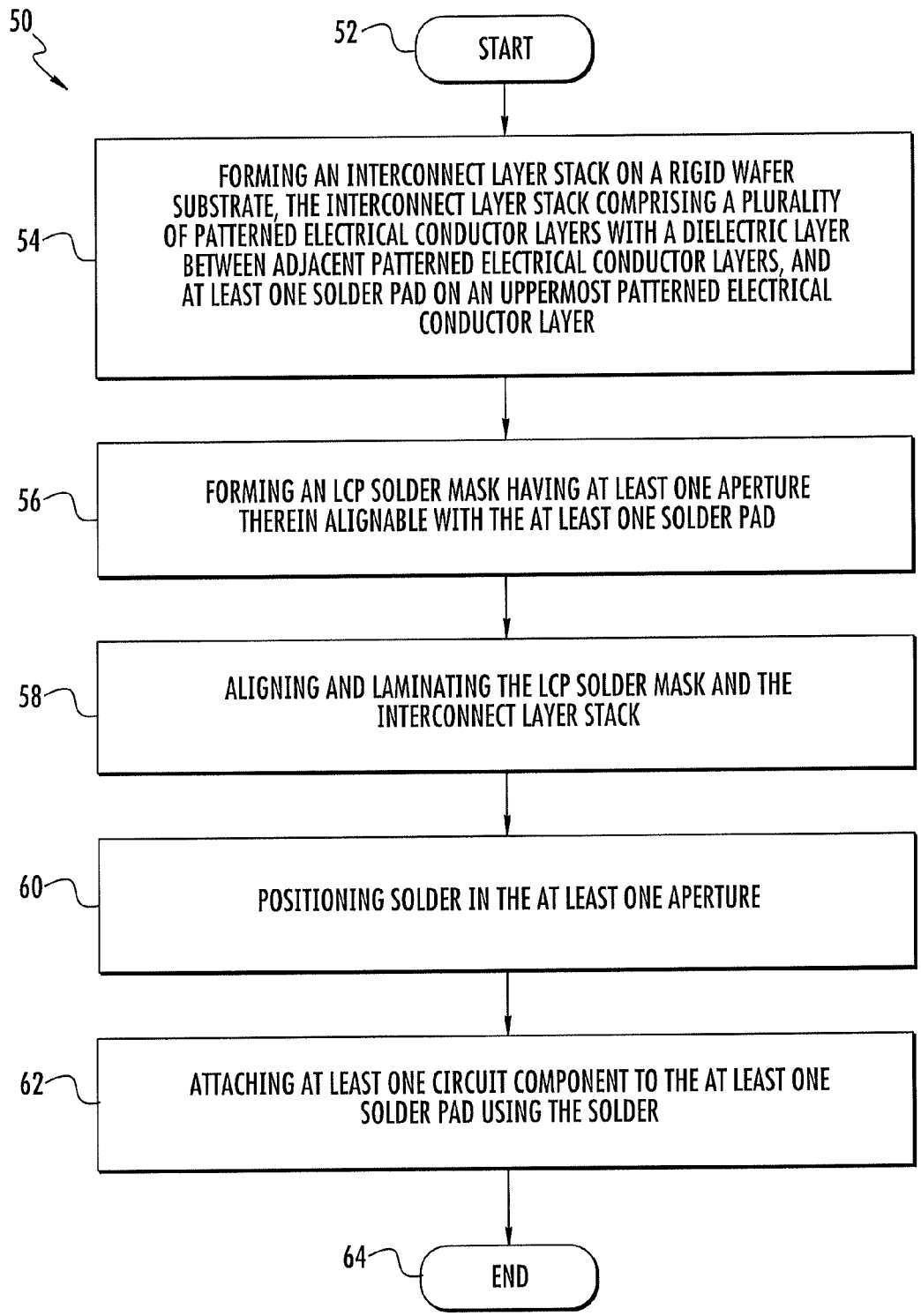
FIG. 1 is a flowchart of a method of making an electronic device according to the present invention.
Figure 2A:
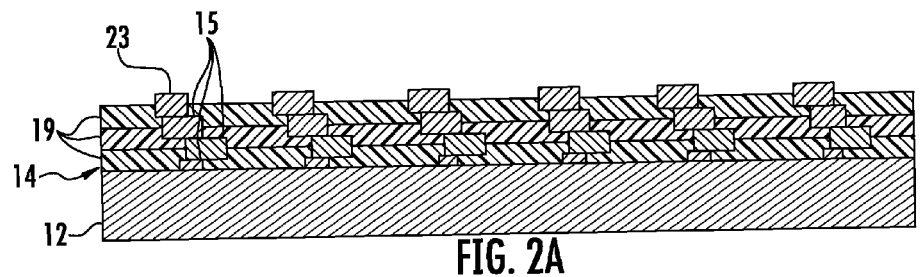
FIG. 2A-2F are sequential schematic cross sectional views of an electronic device of the present invention.

Referring initially to the flowchart 50 of FIG. 1, and FIGS. 2A-2F, a method of making an electronic device is now described. After the start (Block 52), as shown in FIG. 2A, an interconnect layer stack 14 including a plurality of patterned electrical conductor layers 15, with dielectric layers 19 between adjacent patterned electrical conductor layers is formed on a rigid wafer substrate 12. Subsequently, at least one solder pad 23 is formed on the outermost patterned electrical layer with the entire layer stack arranged on the rigid wafer substrate 12 (at Block 54). The solder pads 23 are typically formed from copper, and may be 0.006" or less in diameter. Of course, the solder pads 23 may also have other diameters in some applications.

Figure 2B:
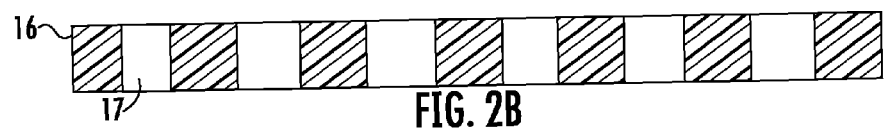
Figure 2C:
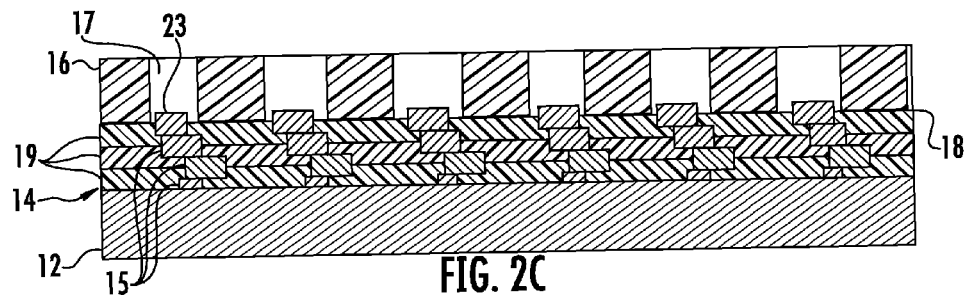

Next, as shown in FIG. 2B, a LOP solder mask 16 having at least one aperture 17 therein alignable with the at least one solder pad 23 is formed (Block 56). The apertures 17 may be as small as 0.001 inch to 0.002 inches, or larger, for example. The LCP solder mask 16 and interconnect layer stack 14 are then laminated together (Block 58), as shown in FIG. 2C. By "alignment" it is meant that the solder pads 23 are contained within the apertures and are accessible for use in dispensing solder and attaching an electronic component. This alignment may be performed by first using a fixture or guide to roughly align the LCP solder mask 16 and the interconnect layer stack 14, and then finely adjusting the alignment under a microscope to reach the final alignment. This method advantageously allows a positional accuracy of alignment in the range of 0.0005 inches to 0.001 inches.

LCP is a particularly advantageous material from which to form solder masks for a variety of reasons, including the fact that it has a high tensile strength, providing a high resistance to abrasion and damage. Typically, LCP also has a high chemical resistance, inherent flame retardancy, and good weatherability. LCP resists stress cracking in the presence of most chemicals at elevated temperatures, including aromatic or halogenated hydrocarbons, strong acids, bases, ketones, and other aggressive industrial substances. Those skilled in the art should understand that there are a variety of LCPs that may be used in the production of electronic devices according to the present invention.

The use of LCP to construct the solder mask 16 results in a solder mask that is thinner than some prior art solder masks, for example 0.001 inch thick as opposed to 0.002+inches thick. This allows for solder mask protection of ball grid arrays down to a 0.008" pitch, advantageously allowing the attachment of integrated circuits with a narrow spacing between pads to a substrate or printed circuit board without increasing the size of the overall package beyond the size of the integrated circuit itself.

In addition, the LCP solder mask 16 exhibits a superior thickness uniformity as compared to some prior art solder masks. Further, the LCP solder mask 16 provides a better electrical isolation than conventional solder masks, having a dielectric strength of approximately 3500 volts per mil, as opposed to the 500 volts per mil of the conventional solder masks. Furthermore, the LCP solder mask 16 seals against the interconnect layer stack 14, protecting it from outside contaminants and protecting the underlying wafer substrate from moisture degradation since LCP forms a near-hermetic material.

Figure 2D:
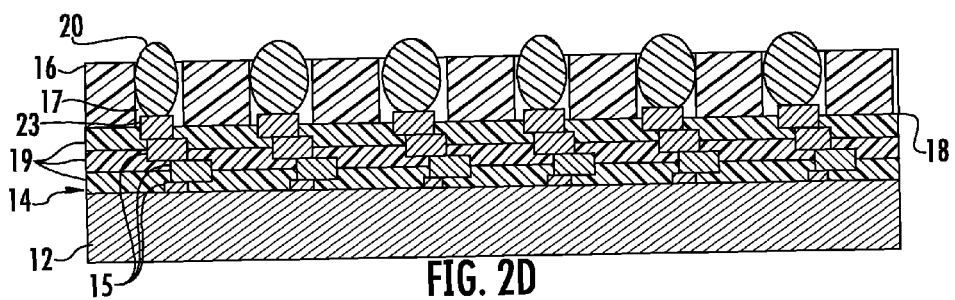
Figure 2E:
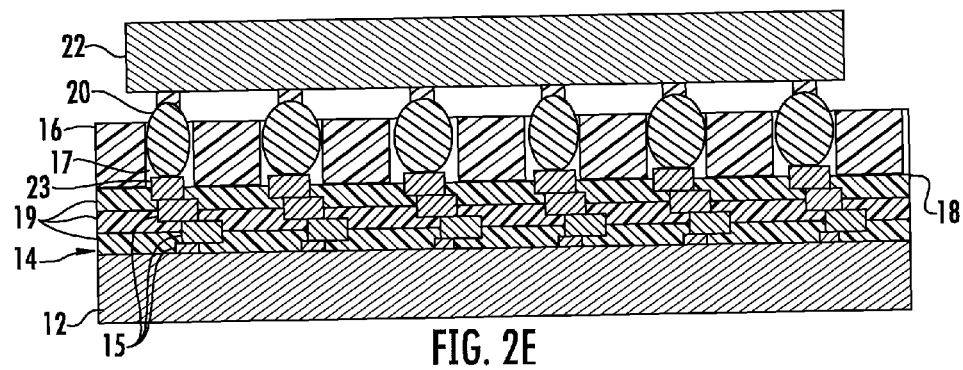

Solder 20 is then positioned in the apertures 17 (Block 60), as shown in FIG. 2D. A circuit component, such as an integrated circuit 22, is then positioned over the solder mask 16 such that the pads thereof contact the solder 20, and are attached thereto using the solder (Block 62), as shown in FIG. 2E. Block 64 indicates the end of the method.

A more detailed method of making an electronic device in accordance with the present is now described with reference to the flowchart 50' of FIG. 3, and also with reference to FIGS. 2A-2F. After the start (Block 52'), the interconnect layer stack 14 is formed on a rigid wafer substrate 12 (Block 54'). Here, the interconnect layer stack 14 includes a plurality of solder pads 23 arranged in an array pattern. In addition, the interconnect layer stack 14, including the patterned electrical conductor layers 15, are formed by conventional thin film deposition methodologies. It should be understood that other methods of forming the interconnect layer stack 14 may also be employed.

Next, the method includes punching and/or laser milling at least one aperture 17 alignable with at least one solder pad 23 of the plurality thereof in the LCP solder mask 16, which has a thickness of less than 0.0015 inch (Block 56'). The LCP solder mask 16 and the interconnect layer stack 14 are then aligned and laminated together via the application of heat and pressure in an autoclave (Block 58'). An autoclave advantageously provides isostatic pressure (i.e. equal pressure from all directions), and helps to keep the LCP from deforming during the lamination process. While the use of an autoclave for lamination is preferred, a press (possible in an inert atmosphere or vacuum bag) may also be used to perform the lamination.

Solder 20 is positioned in the apertures 17 by dipping the device in a solder bath (for example, at 240° C. and for a duration of 5 seconds) or by positioning or depositing solder paste or conductive epoxy in the apertures via a squeegee (Block 60'). The solder does not wet to the LCP solder mask 16. The integrated circuit 22 is then attached to the solder pads 23 by heating the solder 20, which then melts and re-solidifies (Block 62'). Block 64' indicates the end of the method.

Figure 2F:
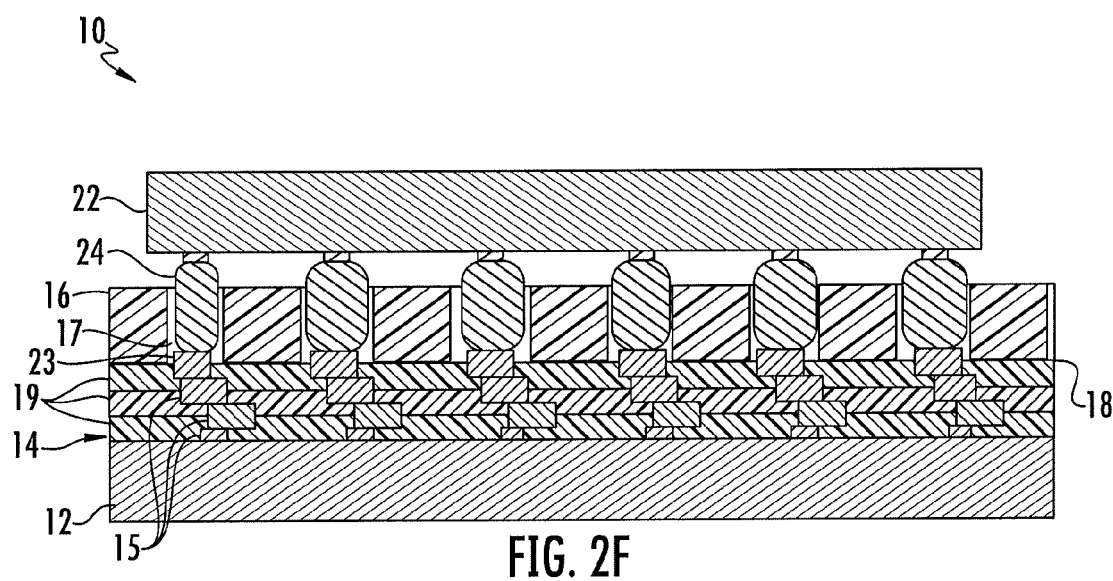
Figure 3:
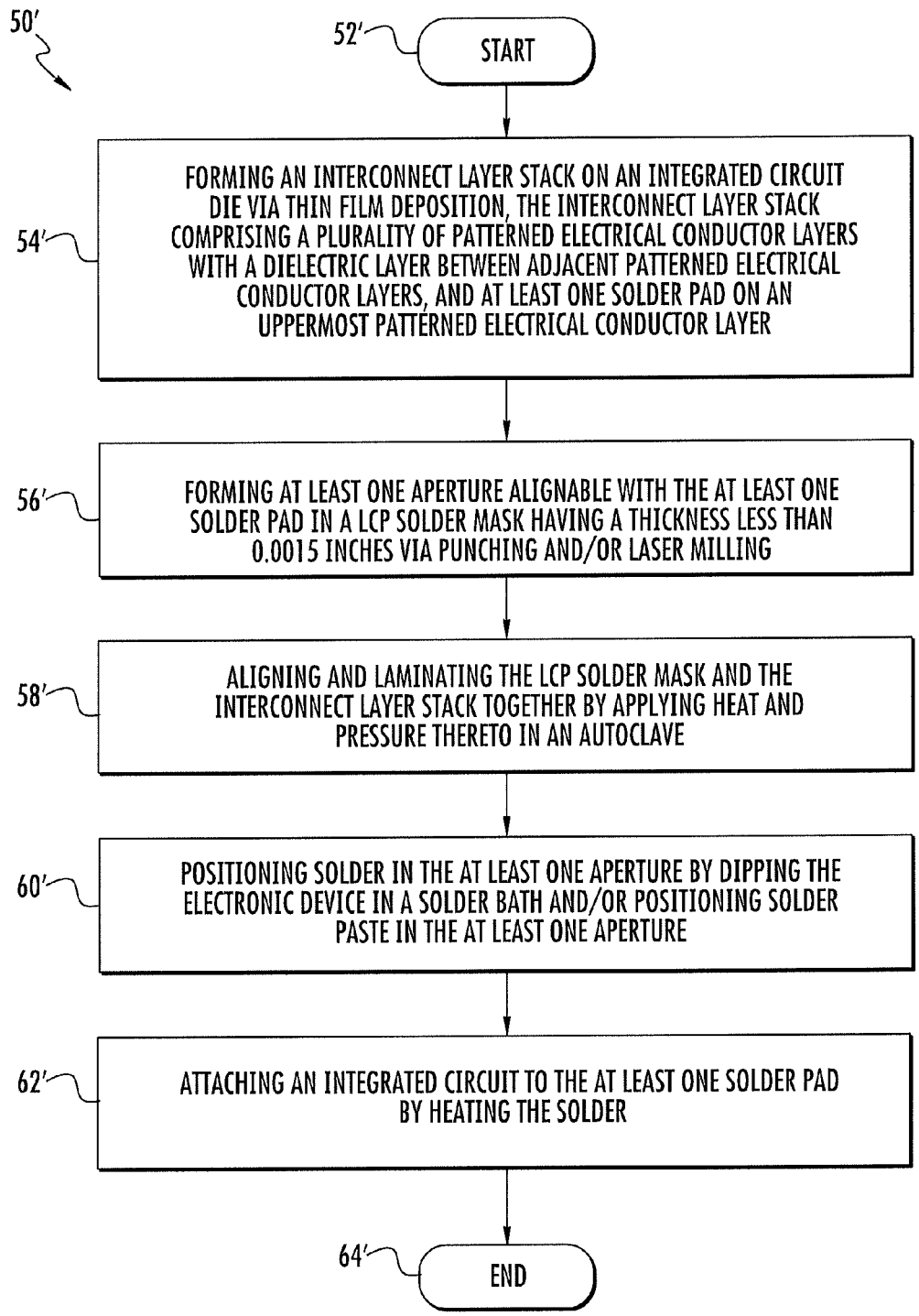
FIG. 3 is a flowchart of a more detailed method of making an electronic device according to the present invention.

The completed electronic device 10 is shown in FIG. 2F. The electronic device 10 comprises the rigid wafer substrate 12, with an interconnect layer stack 14 on the rigid wafer substrate that includes a plurality of patterned electrical conductor layers 15, a dielectric layer 19 between adjacent patterned electrical conductor layers, and at least one solder pad 23 at an uppermost layer of the plurality of patterned electrical conductor layers. The LCP solder mask 16 is on the interconnect layer stack 14, and the solder mask has at least one aperture 17 aligned with the at least one solder pad 23. There is a fused seam 18 between the LCP solder mask 16 and the interconnect layer stack 14. This fused seam 18 is formed during the melting and joining of the LCP solder mask 16 and the interconnect layer stack 14, and is readily visible in a photograph of a cross sectioned device.

Solder 24 (illustratively melted solder) is in the apertures 17, although it should be appreciated that instead of solder a conductive polymeric adhesive may be used. An integrated circuit 22 is electrically coupled to the solder pads 23 via the solder 24.

Other details of methods for making an electronic device 10 may be found in applications METHOD OF TRANSFERRING AND ELECTRICALLY JOINING A HIGH DENSITY MULTILEVEL THIN FILM TO A CIRCUITIZED AND FLEXIBLE ORGANIC SUBSTRATE AND ASSOCIATED DEVICES, and METHOD OF MAKING AN ELECTRONIC DEVICE HAVING A LIQUID CRYSTAL POLYMER SOLDER MASK AND RELATED DEVICES, Ser. No. 61742 and ELECTRONIC DEVICE HAVING LIQUID CRYSTAL POLYMER SOLDER MASK AND OUTER SEALING LAYERS, AND ASSOCIATED METHODS, the entire disclosures of which are hereby incorporated by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method of making an electronic device comprising:

forming an interconnect layer stack on a rigid wafer substrate, said interconnect layer stack comprising a plurality of patterned electrical conductor layers with dielectric layers between adjacent patterned electrical conductor layers, and at least one solder pad on an uppermost patterned electrical conductor layer;

forming an LCP solder mask that is not in contact with the interconnect layer, with the LCP solder mask having at least one aperture therein alignable with the at least one solder pad;

aligning the at least one aperture in the LCP solder mask with the interconnect layer stack;

laminating the LCP solder mask and the interconnect layer stack together;

positioning solder in the at least one aperture; and attaching at least one circuit component to the at least one solder pad using the solder.

2. The method of claim 1, wherein attaching the at least one circuit component comprises heating the solder.

3. The method of claim 1, wherein the solder is positioned in the at least one aperture by dipping the electronic device in a solder bath.

4. The method of claim 1, wherein the solder is positioned in the at least one aperture by depositing solder paste in the at least one aperture.

5. The method of claim 1, wherein the solder is positioned in the at least one aperture by depositing a conductive epoxy in the at least one aperture.

6. The method of claim 1, wherein laminating the LCP solder mask and the interconnect layer stack together comprises applying heat and pressure to the LCP solder mask and the interconnect layer stack.

7. The method of claim 6, wherein applying heat and pressure is performed in an autoclave.

8. The method of claim 1, wherein forming the LCP solder mask comprises at least one of punching and laser milling the LCP solder mask to form the at least one aperture.

9. The method of claim 1, wherein forming the interconnect layer stack comprises forming the plurality of patterned electrical conductor layers by thin film deposition.

10. The method of claim 1, wherein the at least one circuit component comprises at least one integrated circuit.

11. The method of claim 1, wherein the LOP solder mask has a thickness of less than 0.0015 inches.

\* \* \* \* \*